United States Patent
Murazaki et al.

(10) Patent No.: US 8,648,523 B2
(45) Date of Patent: Feb. 11, 2014

(54) LIGHT EMITTING DEVICE INCLUDING LIGHT EMITTING ELEMENT AND PHOSPHOR

(75) Inventors: Yoshinori Murazaki, Anan (JP); Masafumi Harada, Anan (JP); Suguru Takashima, Anan (JP)

(73) Assignee: Nichia Corporation, Anan-Shi (JP)

( * ) Notice: Subject to any disclaimer, the term of this patent is extended or adjusted under 35 U.S.C. 154(b) by 467 days.

(21) Appl. No.: 12/675,722

(22) PCT Filed: Aug. 29, 2008

(86) PCT No.: PCT/JP2008/065520
§ 371 (c)(1),
(2), (4) Date: May 26, 2010

(87) PCT Pub. No.: WO2009/028656
PCT Pub. Date: Mar. 5, 2009

(65) Prior Publication Data
US 2010/0225226 A1 Sep. 9, 2010

(30) Foreign Application Priority Data
Aug. 30, 2007 (JP) ............................. P 2007-224034

(51) Int. Cl.
*H01L 33/00* (2010.01)
*F21V 9/16* (2006.01)

(52) U.S. Cl.
USPC ........................................ 313/503; 362/84

(58) Field of Classification Search
USPC ............ 252/301.4 H, 301.4 F; 313/503, 501; 257/79; 362/84, 231, 293
See application file for complete search history.

(56) References Cited

U.S. PATENT DOCUMENTS

| | | | |
|---|---|---|---|
| 7,582,906 B2 | 9/2009 | Kurihara | |
| 7,661,841 B2 | 2/2010 | Kurihara et al. | |
| 2003/0006469 A1* | 1/2003 | Ellens et al. | 257/432 |
| 2003/0030368 A1* | 2/2003 | Ellens et al. | 313/503 |
| 2003/0038295 A1* | 2/2003 | Koda | 257/98 |

(Continued)

FOREIGN PATENT DOCUMENTS

| | | |
|---|---|---|
| CN | 1677695 A | 10/2005 |
| JP | 2004-327492 A | 11/2004 |

(Continued)

OTHER PUBLICATIONS

Machine translation of Hosokawa et al. JP 2006-306981 A.*

(Continued)

*Primary Examiner* — Nimeshkumar Patel
*Assistant Examiner* — Steven Horikoshi
(74) *Attorney, Agent, or Firm* — Birch, Stewart, Kolasch & Birch, LLP

(57) ABSTRACT

The light emitting device comprises a light emitting element, a red phosphor formed from a nitride phosphor and a green phosphor formed from a halosilicate, wherein the emission spectrum has a first peak at a wavelength between 440 nm and 470 nm, a second peak at a wavelength between 510 nm and 550 nm and a third peak at a wavelength between 630 nm and 670 nm, and the minimum relative light emission intensity between the second peak wavelength and the third peak wavelength is 80% or less of whichever the lower of the relative light emission intensity of the second peak wavelength and the relative light emission intensity of the third peak wavelength.

17 Claims, 6 Drawing Sheets

(56) References Cited

U.S. PATENT DOCUMENTS

| | | | |
|---|---|---|---|
| 2004/0135504 A1* | 7/2004 | Tamaki et al. | 313/512 |
| 2004/0207313 A1* | 10/2004 | Omoto et al. | 313/503 |
| 2005/0057145 A1* | 3/2005 | Shieh et al. | 313/503 |
| 2005/0156496 A1* | 7/2005 | Takashima et al. | 313/237 |
| 2006/0126326 A1* | 6/2006 | Ng et al. | 362/231 |
| 2006/0263627 A1 | 11/2006 | Grampeix et al. | |
| 2006/0279196 A1 | 12/2006 | Hsu | |
| 2007/0057626 A1 | 3/2007 | Kurihara et al. | |
| 2007/0147032 A1* | 6/2007 | Furukawa et al. | 362/230 |
| 2007/0200095 A1 | 8/2007 | Murazaki | |
| 2007/0210326 A1 | 9/2007 | Kurihara | |
| 2007/0259206 A1 | 11/2007 | Oshio | |
| 2008/0035887 A1 | 2/2008 | Iwao et al. | |
| 2008/0128654 A1 | 6/2008 | Oshio | |
| 2008/0149893 A1* | 6/2008 | Chen et al. | 252/301.4 S |
| 2008/0149957 A1 | 6/2008 | Kameshima et al. | |
| 2008/0182127 A1 | 7/2008 | Oshio | |
| 2008/0191610 A1 | 8/2008 | Oshio | |
| 2008/0211389 A1 | 9/2008 | Oshio | |
| 2008/0258110 A1 | 10/2008 | Oshio | |
| 2009/0250663 A1 | 10/2009 | Oshio | |
| 2009/0295272 A1 | 12/2009 | Oshio | |
| 2010/0171440 A1 | 7/2010 | Satou et al. | |
| 2010/0225226 A1 | 9/2010 | Murazaki et al. | |

FOREIGN PATENT DOCUMENTS

| | | | |
|---|---|---|---|
| JP | 2006-219636 A | | 8/2006 |
| JP | 2006-523245 A | | 10/2006 |
| JP | 2006-306981 A | | 11/2006 |
| JP | 2006306981 A | * | 11/2006 |
| JP | 2006-332134 A | | 12/2006 |
| JP | 2007-27796 A | | 2/2007 |
| JP | 2007-88248 A | | 4/2007 |
| JP | 2007-145958 A | | 6/2007 |
| WO | WO 2006/077740 A1 | | 7/2006 |

OTHER PUBLICATIONS

U.S. Office Action for copending U.S. Appl. No. 12/675,713 dated Dec. 19, 2011.

U.S. Office Action issued in co-pending U.S. Appl. No. 12/675,713 dated Jun. 20, 2012.

* cited by examiner

LIGHT EMITTING DEVICE INCLUDING LIGHT EMITTING ELEMENT AND PHOSPHOR

TECHNICAL FIELD

The present invention relates to a light emitting device, and particularly to a light emitting device that contains a light emitting element, a red phosphor and a green phosphor, and emits white light.

BACKGROUND ART

To provide a light emitting device that emits white light of warm color tone having high flux and high color rendering performance, it has been proposed to constitute the light emitting device from a blue semiconductor light emitting element, a red phosphor and a green phosphor that emit light when excited by the light from the light emitting element (refer to, for example, Patent Document 1).

Such light emitting devices show high intensity of emission in a region of reddish colors, and are widely used for lighting and other applications.

Patent Document 1: JP2007-27796A

DISCLOSURE OF THE INVENTION

Problems the be Solved by the Invention

However, the white light emitting device has diversified applications, and color reproducibility of the conventional light emitting device comprising the blue semiconductor light emitting element (blue LED), the red phosphor and the green phosphor as described above is not sufficient for some applications such as the backlight for liquid crystal display. A backlight of liquid crystal display constituted from the conventional white light emitting device has such a problem that a picture displayed thereby has insufficient color reproducibility with NTSC ratio of less than 70%, due to the insufficient color reproducibility of the backlight.

An object of the present invention is to provide a light emitting device having excellent color reproducibility that can be used in such applications as described above.

Means for Solving the Problems

A first aspect of the present invention is a light emitting device comprising a light emitting element, a red phosphor formed from a nitride phosphor and a green phosphor formed from a halosilicate, wherein the emission spectrum has a first peak at a wavelength between 440 nm and 470 nm, a second peak at a wavelength between 510 nm and 550 nm and a third peak at a wavelength between 630 nm and 670 nm, and the minimum relative light emission intensity between the second peak wavelength and the third peak wavelength of the emission spectrum is 80% or less of whichever the lower of the relative light emission intensity of the second peak wavelength and the relative light emission intensity of the third peak wavelength.

A second aspect of the present invention is the light emitting device according to the first aspect, wherein the red phosphor is activated with Eu and is represented by the following general formula (I):

$$M^1_w Al_x Si_y B_z N_{(2/3)w+x+(4/3)y+z} : EU^{2+} \quad (I)$$

wherein $M^1$ is at least one kind of element selected from the group consisting of Mg, Ca, Sr and Ba, and relations: $0.056 \le w \le 9$, $x=1$, $0.056 \le y \le 18$ and $0 \le z \le 0.5$ are satisfied.

A third aspect of the present invention is the light emitting device according to the first or second aspect, wherein the green phosphor is represented by the following general formula (II):

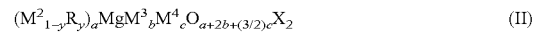

$$(M^2_{1-y} R_y)_a MgM^3_b M^4_c O_{a+2b+(3/2)c} X_2 \quad (II)$$

wherein $M^2$ is at least one kind of element selected from the group consisting of Ca, Sr, Ba, Zn and Mn, $M^3$ is at least one kind of element selected from the group consisting of Si, Ge and Sn, $M^4$ is at least one kind of element selected from the group consisting of B, Al, Ga and In, X is at least one kind of element selected from the group consisting of F, Cl, Br and I, R is at least one kind of element selected from among the rare earth elements so that Eu is contained as an essential element (or indispensable component), and relations: $0.0001 \le y \le 0.3$, $7.0 \le a < 10.0$, $3.0 \le b < 5.0$ and $0 \le c < 1.0$ are satisfied.

A fourth aspect of the present invention is the light emitting device according to the first or second aspect, wherein the green phosphor is represented by the following general formula (III):

$$M^5_x Eu_y MgSi_z Al_w O_a X_b N_c \quad (III)$$

wherein $M^5$ is at least one kind of element selected from the group consisting of Ca, Sr, Ba, Zn and Mn, X is at least one kind of element selected from the group consisting of F, Cl, Br and I, and relations: $6.5 \le x < 8.0$, $0.01 \le y \le 2.0$, $3.7 \le z \le 4.3$, $0 < w \le 0.5$, $a = x+y+1+2z+(3/2)w-b/2-(3/2)c$, $1.0 \le b \le 1.9$ and $0 \le c \le 3.0$ are satisfied.

A fifth aspect of the present invention is the light emitting device according to any one of the first to fourth aspects, wherein the difference between the peak wavelength of the red phosphor and the peak wavelength of the green phosphor is 120 nm or more.

A sixth aspect of the present invention is the light emitting device according to any one of the first to fifth aspects, further comprising a YAG phosphor that emits light when excited by the light from the light emitting element, wherein the difference between the peak wavelength of the green phosphor and the peak wavelength of the YAG phosphor is 30 nm or less, and the amount of the added YAG phosphor is not higher than 50% by weight of the total phosphor.

A seventh aspect of the present invention is the light emitting device according to the sixth aspect, wherein the YAG phosphor is represented by the following general formula (IV):

$$M^6_3 M^7_5 O_{12} : Ce \quad (IV)$$

wherein $M^6$ is at least one kind of element selected from the group consisting of the rare earth elements, and $M^7$ is at least one kind of element selected from the group consisting of B, Al, Ga and In.

Effects of the Invention

Combining a light emitting element, a red phosphor and a green phosphor so as to obtain predetermined emission wavelength and predetermined peak intensity can provide a light emitting device having excellent color reproducibility.

DESCRIPTION OF REFERENCE NUMERALS

Figure 1:
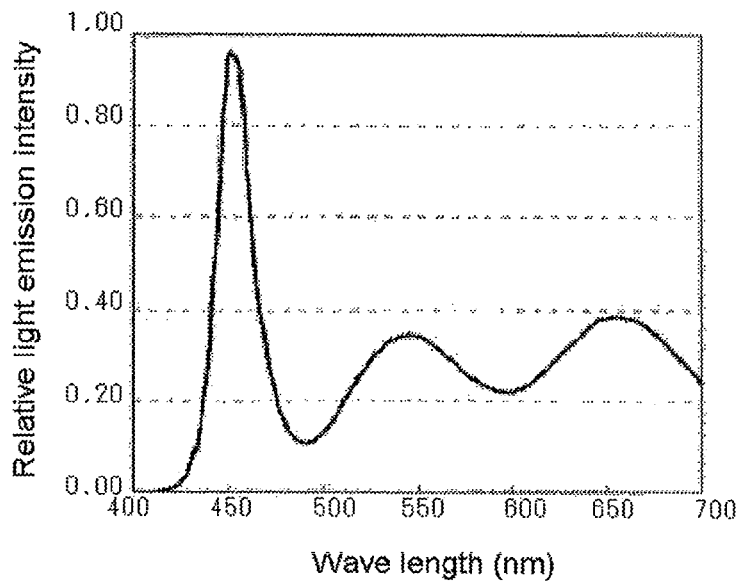
FIG. 1 is a graph showing an emission spectrum of a light emitting device 100 according to Example 1.

1 Light emitting element mounting body
2 Light emitting element
3A Red phosphor
3B Green phosphor
4 Translucent resin
5, 7 Electrically conductive wire
6, 8 External electrode
9 Light reflector
100 Light emitting device

BEST MODE FOR CARRYING OUT THE INVENTION

Figure 2:
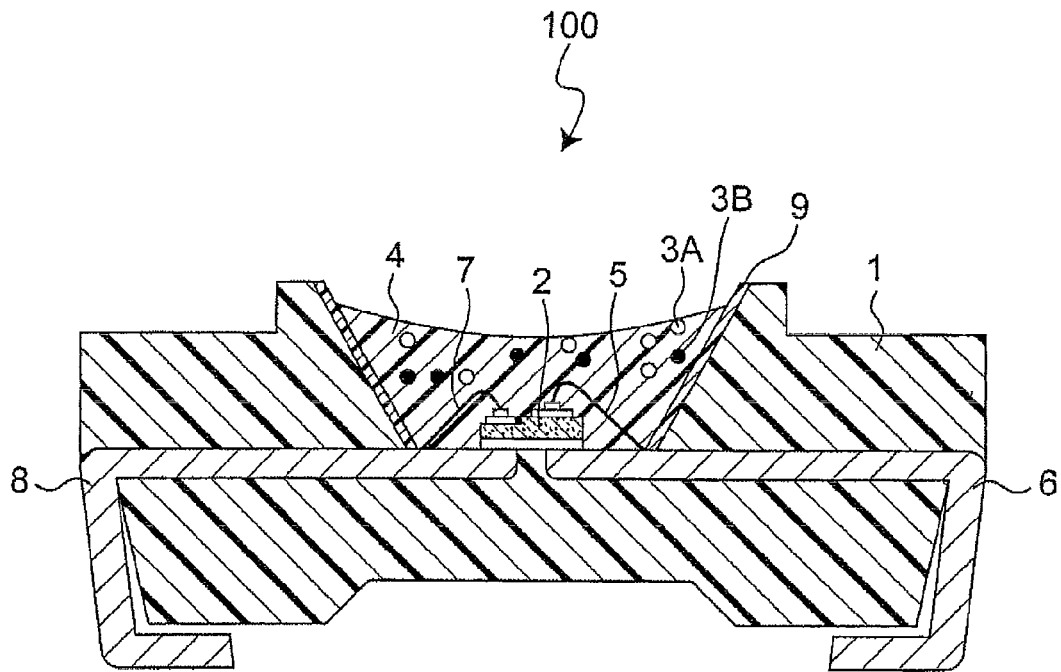
FIG. 2 is a sectional view showing the light emitting device 100 according to the present invention.

FIG. 1 shows an emission spectrum of a light emitting device 100 according to an embodiment (Example 1) of the present invention of which details will be described later. FIG. 2 is a sectional view of the light emitting device 100, showing an example of constitution of the light emitting device according to the present invention.

The emission spectrum shown in FIG. 1 has a first peak (first peak wavelength) at a wavelength around 455 nm attributed mainly to the light emitted by a light emitting element (blue LED) 2. The spectrum has a second peak (second peak wavelength) at a wavelength around 525 nm. Emission at the second peak wavelength is caused mainly by the light emission of a green phosphor 3B that is excited by the light emitted by the blue LED 2. The spectrum also has a third peak (third peak wavelength) at a wavelength around 660 nm. Emission at the third peak wavelength is caused mainly by the light emission of a red phosphor 3A that is excited by the light emitted by the blue LED 2.

Thus the light emitting device 100 according to the present invention comprises the blue LED (light emitting element) 2, the red phosphor (red light emitting phosphor) 3A and the green phosphor (green light emitting phosphor) 3B, wherein the red phosphor and the green phosphor are excited by the light from the blue LED 2 to emit red and green light, respectively. The light emitting device 100 produces the emission spectrum shown in FIG. 1 by blending the light emitted by the blue LED 2, the red phosphor 3A and the green phosphor 3B.

Figure 8:
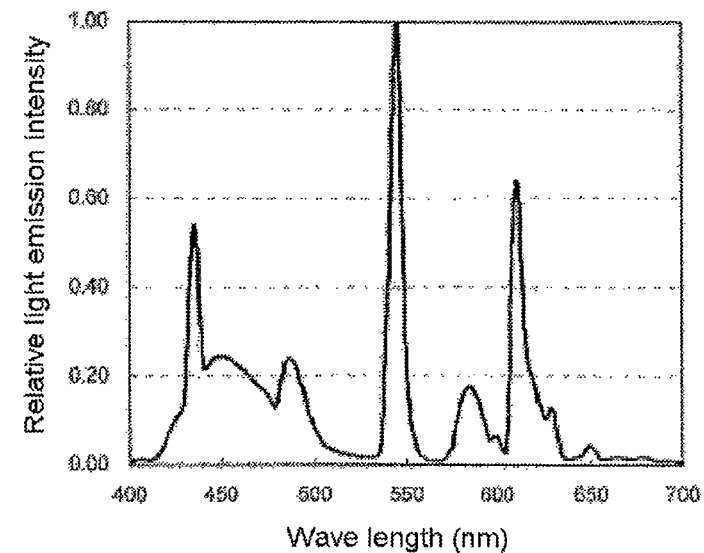
FIG. 8 is a graph showing an emission spectrum of a cold cathode fluorescent lamp (CCFL).
Figure 9:
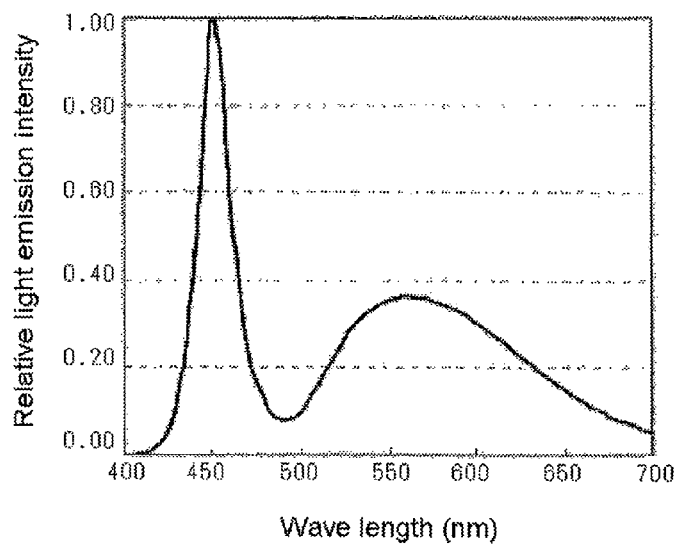
FIG. 9 is a graph showing an emission spectrum of a conventional white LED.

For the purpose of comparison, FIG. 8 and FIG. 9 show the emission spectrum of a cold cathode fluorescent lamp (CCFL) that has been used as the backlight of display apparatus, and the emission spectrum of a light emitting device that blends light of two colors emitted by a blue LED and a phosphor such as YAG (yttrium-aluminum-garnet) that is excited by the light emitted by the blue LED.

The emission spectrum of a cold cathode fluorescent lamp (CCFL) has five sharp peaks including a peak around 435 nm due to mercury, a main peak around 545 nm due to a green phosphor and two sub-peaks around 490 nm and 585 nm. In contrast, the emission spectrum of the light emitting device that blends light of two colors shows only two peaks. Both the emission spectrum of the cold cathode fluorescent lamp (CCFL) and the emission spectrum of the light emitting device that blends light are different from the emission spectrum of the light emitting device 100 according to the present invention shown in FIG. 1.

The inventors of the present invention found, through researches, that with an emission spectrum that satisfies four conditions described below, it is possible to obtain a light emitting device that shows excellent color reproducibility, in other words emitting light over a sufficiently wide range of color reproducibility.

First, the light emitting element 2 is selected so that peak wavelength of the emission spectrum thereof is within an appropriate range (for example, between 440 nm and 470 nm) and that the first peak wavelength of the emission spectrum is between 440 nm and 470 nm.

Second, the green phosphor 3B is formed from a halosilicate which will be described in detail later, and the second peak wavelength of the emission spectrum is between 510 nm and 550 nm.

Third, the red phosphor 3A is formed from a nitride phosphor which will be described in detail later, and the third peak wavelength of the emission spectrum is between 630 nm and 670 nm.

By setting the first to third peak wavelengths (emission peak wavelength) within limited ranges as described above, it is possible to reduce the proportions of blue-green light and orange light that tend to decrease the color reproducibility, and improve the color reproducibility accordingly.

Forth, the minimum relative light emission intensity between the second peak wavelength and the third peak wavelength (relative light emission intensity of the lowest value in a range between the second peak wavelength and the third peak wavelength of the emission spectrum) is 80% or less of whichever the lower of the relative light emission intensity of the second peak wavelength and the relative light emission intensity of the third peak wavelength.

With regard to the fourth condition, it is possible to make the minimum relative light emission intensity between the second peak wavelength and the third peak wavelength of the emission spectrum 80% or less of whichever the lower of the relative light emission intensity of the second peak wavelength and the relative light emission intensity of the third peak wavelength by, for example, setting the difference between the peak wavelength of the red phosphor 3A and the peak wavelength of the green phosphor 3B to 120 nm or greater.

This is due to the fact, which will be described in detail later, that half maximum full-width (or half power width) of the emission spectrum of the red phosphor 3A is roughly 110 nm or less and half maximum full-width of the emission spectrum of the green phosphor 3B is roughly 80 nm or less. That is, by setting the difference between the peak wavelength of the red phosphor 3A and the peak wavelength of the green phosphor 3B, both having such half maximum full-widths, to 120 nm or greater, it is possible to make the minimum relative light emission intensity between the second peak wavelength and the third peak wavelength of the emission spectrum, that is the valley between the two peaks, 80% or less of whichever the lower of the relative light emission intensity of the second peak wavelength and the relative light emission intensity of the third peak wavelength.

By satisfying the four conditions described above, it is possible to make the light emitting device 100 with emission spectrum having sufficiently wide range of color reproducibility, for example, with NTSC ratio of 70% or higher.

The NTSC ratio is the ratio of the area of a triangle defined by three chromaticity points (red, green, blue) of the display apparatus to be evaluated to the area of a triangle defined by the chromaticity points of three primary colors, red (0.670, 0.330), green (0.210, 0.710) and blue (0.140, 0.080), of the standard chromaticity (x, y) according to the CIE1931 XYZ display color system established by the National Television Standards Committee of the USA. The range of color reproducibility is defined by the area ratio, and a higher area ratio means higher, color reproducibility. In broadcasting, standard NTSC ratio is usually set to 72%, and it is considered that NTSC ratio should be 70% or higher, and preferably 72% or higher in order to provide satisfactory color reproducibility. NTSC ratio less than 70% results in a region that cannot be represented on the display and is deemed undesirable.

A display apparatus such as that of monitor, digital camera or printer, where the light emitting device of the present invention having the wide range of color reproducibility as described above is used as the backlight, is capable of richly and clearly reproducing the RGB colors of each device (display apparatus).

For a liquid crystal display apparatus used in an automobile, reproduction of red color is important for giving a warning sign of danger, and it is highly desirable that red and orange colors can be clearly distinguished on the display. When the minimum relative light emission intensity between the second peak wavelength and the third peak wavelength of the emission spectrum is greater than 80% of whichever the lower of the relative light emission intensity of the second peak wavelength and the relative light emission intensity of the third peak wavelength, then color reproducibility of red decreases and red may be perceived as vermilion or orange. When the minimum relative light emission intensity is 80% or less, y value falls within a range that ensures proper perception of red. Value of y is chromaticity of the CIE1931 XYZ display color system that is strongly related to the brightness of green light emission.

As the minimum relative light emission intensity between the second peak wavelength and the third peak wavelength becomes smaller than whichever the lower of the relative light emission intensity of the second peak wavelength and the third peak wavelength, the backlight provides greater contribution to the representation of deep red. The wavelength region between the second peak wavelength and the third peak wavelength corresponds to orange. A spectrum having lower relative light emission intensity in this wavelength region means lower intensity of orange light (or smaller amount of orange color component), and accordingly higher intensity of deep red light (larger amount of deep red color component).

While the first peak is formed mainly by the light emitted by the light emitting element 2, light emitted by the red phosphor 3A and light emitted by the green phosphor 3B also contribute to the formation of the first peak (particularly the light emitted by the green phosphor 3B). As a result, the first peak wavelength may be different from the peak wavelength of light emitted by the light emitting element 2.

Similarly, while the second peak is formed mainly by the light emitted by the green phosphor 3B, light emitted by the light emitting element 2 and light emitted by the red phosphor 3A also contribute to the formation of the second peak. As a result, the second peak wavelength may be different from the peak wavelength of the green phosphor 3B.

Moreover, while the third peak is formed mainly by the light emitted by the red phosphor 3A, light emitted by the light emitting element 2 and light emitted by the green phosphor 3B also contribute to the formation of the third peak (particularly light emitted by the green phosphor 3B). As a result, the third peak wavelength may be different from the peak wavelength of the red phosphor 3A.

Components of the light emitting device 100 containing the red phosphor 3A, the green phosphor 3B and the light emitting element (blue LED) 2 will be described in detail below.

1. Red Phosphor

The red phosphor (red light emitting phosphor) 3A is formed from a nitride phosphor that absorbs ultraviolet ray or blue light emitted by the light emitting element 2 and emits red light.

A nitride phosphor activated with Eu and represented by the following general formula (I) containing group II element $M^1$, Si, Al, B and N may be used as the red phosphor 3A.

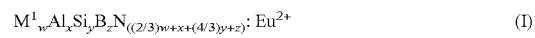

In formula (I), $M^1$ is at least one kind of element selected from the group consisting of Mg, Ca, Sr and Ba, while w, x, y and z preferably satisfy relations: $0.056 \leq w \leq 9$, $x=1$, $0.056 \leq y \leq 18$ and $0.0005 \leq z \leq 0.5$.

More preferably w, x, y and z satisfy relations: $0.4 \leq w \leq 3$, $x=1$, $0.143 \leq y \leq 8.7$ and $0 \leq z \leq 0.5$, and most preferably satisfy $0.5 \leq w \leq 3$, $x=1$, $0.167 \leq y \leq 8.7$ and $0.0005 \leq z \leq 0.5$, which enable it to obtain a color tone, high brightness and half maximum full-width of light emission that are more desirable. The value of z is preferably 0.5 or less, more preferably 0.3 or less and not less than 0.0005. It is further preferable that molar concentration of boron is 0.001 or more and 0.2 or less. While the nitride phosphor 3A is activated with Eu, a part of Eu may be substituted with at least one kind of rare earth element selected from the group consisting of Sc, Tm, Yb, Y, La, Ce, Pr, Nd, Sm, Gd, Tb, Dy, Ho, Er and Lu.

In formula (I), $M^1$ is preferably at least one kind of Ca and Sr, while w, x, y and z preferably satisfy relations: $0.5 \leq w \leq 1.5$, $x=1$, $0.5 \leq y \leq 1.5$ and $0 \leq z \leq 0.3$, which enable it to obtain a more desirable color tone, high brightness, more desirable half maximum full-width of light emission and emission of light having richer red color tone with less orange component.

Another preferable nitride phosphor is one represented by the following general formula (I'):

where $M^1$ is at least one kind selected from the group consisting of Mg, Ca, Sr and Ba, while x is a range of $0.001 \leq x \leq 0.3$ and z is in a range of $0.0005 \leq z \leq 0.5$.

Further another preferable nitride phosphor is one represented by the following general formula (I"):

$$M^1{}_w AlSiB_z N_{(2/3)w+(7/3)+z} : Eu^{2+} \quad (I'')$$

where $M^1$ is at least one kind of element selected from the group consisting of Mg, Ca, Sr and Ba, while w is in a range of $0.04 \leq w \leq 3$ and z is in a range of $0.0005 \leq z \leq 0.5$.

In formulas (I), (I') and (I"), in case that Ca is used as $M^1$, it is preferable to use Ca individually. However, a part of Ca may be substituted with Sr, Mg or Ba, combination of Sr and Ba, or the like. Peak wavelength of the emission by the nitride phosphor can be controlled by substituting a part of Ca by Sr.

While Si is also preferably used individually, a part of Si may be substituted with group IV element C or Ge. A nitride phosphor that is low-cost and has good crystallinity can be obtained when only Si is used.

Peak wavelength of light emitted by the red phosphor 3A is preferably between 590 nm and 700 nm, more preferably between 630 nm and 670 nm, and further more preferably between 640 nm and 670 nm.

For example, the third peak wavelength of the light emitting device 100 can be shifted within a desired range by shifting the peak wavelength of light emitted by the red phosphor 3A within the preferable range described above.

In case that Ca is used as $M^1$, the peak wavelength of light emitted by the red phosphor can be shifted to longer side by increasing Eu concentration and to shorter side by decreasing Eu concentration. Specifically, substituting 3 mol % of Ca with Eu sets the peak wavelength of the red phosphor 3A at 660 nm, and substituting 1 mol % of Ca with Eu sets the peak wavelength of the red phosphor 3A at 650 nm.

When Sr is used as part or entire $M^1$, the wavelength of the red phosphor 3A can be shifted to shorter side.

Shifting the peak wavelength of light emitted by the red phosphor 3A to shorter side usually causes the third peak wavelength of the light emitting device 100 to shift to shorter side, and shifting the peak wavelength of light emitted by the red phosphor 3A to longer side usually causes the third peak wavelength of the light emitting device 100 to shift to longer side.

As described previously, there can be a case where the peak wavelength of the red phosphor 3A does not agree with the third peak wavelength, and therefore the third peak wavelength may be set within a range from 630 nm to 670 nm even when the peak wavelength of the red phosphor 3A is not in the range from 630 nm to 670 nm.

The activator agent Eu is preferably used individually, although a part of Eu may be substituted with Sc, Tm, Yb, Y, La, Ce, Pr, Nd, Sm, Gd, Tb, Dy, Ho, Er or Lu. When a part of Eu is substituted with the other element, the other element functions as a co-activator. Use of the co-activator enables it to change the color tone and control the emission characteristic.

The red phosphor 3A that is a nitride phosphor may also contain at least one kind of element selected from the group consisting of group I elements of Cu, Ag and Au, group III elements of Ga and In, group IV elements of Ti, Zr, Hf, Sn and Pb, group V elements of P, Sb and Bi and group VI element of S, with total concentration from 1 to 500 ppm. Since these elements are scattered during a firing in the manufacturing process, concentration of these elements in the fired material is lower than the initial concentration when the material is prepared. Therefore, it is preferable to add these elements to the stock material with a concentration of 1,000 ppm or less. Efficiency of light emission can be controlled by adding these elements.

The ratio of the molar concentration of Fe, Ni, Cr, Ti, Nb, Sm and Yb to the molar concentration of $M^1$ is preferably 0.01 or lower. This is because an excessively high concentration of Fe, Ni, Cr, Ti, Nb, Sm and Yb may lower the brightness of emission.

2. Green Phosphor

The green phosphor (green light emitting phosphor) 3B will be described below. The green phosphor 3B is formed from a halosilicate. The green phosphor 3B absorbs ultraviolet ray or blue light emitted by the light emitting element 2 and emits green light.

A phosphor represented by the following general formula (II) may be used as the green phosphor 3B.

$$(M^2{}_{1-y} R_y)_a MgM^3{}_b M^4{}_c O_{a+2b+(3/2)c} X_2 \quad (II)$$

In formula (II), $M^2$ is at least one kind of element selected from the group consisting of Ca, Sr, Ba, Zn and Mn, $M^3$ is at least one kind of element selected from the group consisting of Si, Ge and Sn, $M^4$ is at least one kind of element selected from the group consisting of B, Al, Ga and In, X is at least one kind of element selected from the group consisting of F, Cl, Br and I, R is at least one kind of element selected from among the rare earth elements with Eu contained as an essential element (or indispensable component), while y, a, b and c satisfy relations: $0.0001 \leq y \leq 0.3$, $7.0 \leq a < 10.0$, $3.0 \leq b < 5.0$ and $0 \leq c < 1.0$.

The green phosphor represented by the general formula (II) contains at least one kind of element selected from the group consisting of Ca, Sr, Ba, Zn and Mn, preferably Ca. In case Ca is contained, a part of Ca may be substituted with Mn, Sr or Ba.

Of the phosphors represented by formula (II), more preferable green phosphor is represented by the following general formula (II'). The green phosphor 3B represented by the general formula (II') shows excellent color reproducibility, because of high brightness, narrow half maximum full-width of light emission and lower contents of blue-green and orange.

$$(M^2{}_{1-y} Eu_y)_a MgM^3{}_b O_{a+2b} X_2 \quad (II')$$

In formula (II'), $M^2$ is at least one kind of Ca and Mn, $M^3$ is at least one kind of Si and Ge, and X is at least one kind of element selected from the group consisting of F, Cl, Br and I.

Values of y, a and b satisfy the relations: $0.001 \leq y \leq 0.3$, $7.0 \leq a < 10.0$, and $3.0 \leq b < 5.0$.

The green phosphors represented by the general formulas (II) and (II') contain at least one kind of element selected from the group consisting of Ca, Sr, Ba, Zn and Mn, preferably Ca. In case Ca is contained, a part of Ca may be substituted with Mn, Sr or Ba.

The green phosphors represented by the general formulas (II) and (II') contain at least one kind of element selected from the group consisting of Si, Ge and Sn, preferably Si. In case Si is contained, a part of Si may be substituted with Ge or Sn.

The green phosphors represented by the general formulas (II) and (II') contain at least one kind of element selected from the group consisting of F, Cl, Br, and I, preferably Cl. In case Cl is contained, a part of Cl may be substituted with F, Br or I.

The green phosphor represented by the general formula (II) contains at least one kind of rare earth element with Eu contained as an essential element. The term rare earth collectively refers to 17 elements of scandium, yttrium and lanthanoid elements. Of these elements, Eu is most preferably used.

A part of Eu may be substituted with Ce, Pr, Nd, Sm, Tb, Dy, Ho, Er, Tm or Yb. More preferably, a part of Eu may be substituted with Ce, Pr, Nd, Sm, Tb, Dy, Ho or Tm.

The green phosphors represented by the general formulas (II) and (II') have peak wavelength in a region ranging from green to yellow having wavelengths from 490 nm to 584 nm. The phosphors may have peak wavelength around a range from 500 nm to 520 nm when Ca, Eu, Mg, Si, O and Cl are contained, or around a range from 530 nm to 570 nm when Ca, Mn, Eu, Mg, Si, O and Cl are contained. Since the peak wavelength varies depending on the amounts of elements contained and the composition, the green phosphor 3B is adjusted as required so as to have the preferable peak wavelength described below.

The peak wavelength of the green phosphor 3B is preferably between 490 nm and 560 nm, more preferably between 500 nm and 550 nm, and further more preferably between 505 nm and 540 nm.

The second peak wavelength of the light emitting device 100 can be shifted within a desired range by shifting the peak wavelength of light emitted by the green phosphor 3B within the preferable range described above.

In a composition of $(Ca, Eu)_8MgSi_4O_{16}Cl_2$, for example, peak wavelength of the green phosphor 3B can be shifted to 525 nm on the longer side by increasing Eu concentration to 10 mol % of Ca. Peak wavelength can be shifted to the shorter side by decreasing the Eu concentration relative to Ca. For example, peak wavelength can be shifted to around 500 nm on the shorter side by decreasing Eu concentration to 1 mol % of Ca.

In a composition of $(Ca, Eu, Mn)_8MgSi_4O_{16}Cl_2$, the emission peak due to Eu only can be shifted to around 545 nm of Mn emission by increasing Mn concentration to 5 mol % of Ca.

Shifting the peak wavelength of light emitted by the green phosphor 3B to the shorter side usually shifts the second peak wavelength of the emission spectrum of the light emitting device 100 to the shorter side, and shifting the peak wavelength of the green phosphor 3B to the longer side usually shifts the second peak wavelength of the emission spectrum of the light emitting device 100 to the longer side.

As described previously, there can be a case where the peak wavelength of the green phosphor 3B does not agree with the second peak wavelength, and therefore the second peak wavelength may be set within a range from 510 nm to 550 nm even when the peak wavelength of the green phosphor 3B is not in the range from 510 nm to 550 nm.

Another green phosphor represented by the following general formula (III) that can be used as the green phosphor 3B will be described below.

$$M^5{}_xEu_yMgSi_zAl_wO_aX_bN_c \qquad (III)$$

In the general formula (III), $M^5$ is at least one kind of element selected from the group consisting of Ca, Sr, Ba, Zn and Mn, X is at least one kind of element selected from the group consisting of F, Cl, Br and I, while x, y, w, a, b and c satisfy the relations: $6.5 \leq x < 8.0$, $0.01 \leq y \leq 2.0$, $3.7 \leq z \leq 4.3$, $0 < w \leq 0.5$, $a = x+y+1+2z+(3/2)w-b/2-(3/2)c$, $1.0 \leq b \leq 1.9$ and $0 \leq c \leq 3.0$.

In the general formula (III), it is preferable that w=0 and c=0 which causes the green phosphor to emit light with higher brightness. In this case, the formula (III) can be written as $M^5{}_xEu_yMgSi_zO_aX_b$.

It is possible to make the minimum relative light emission intensity between the second peak wavelength and the third peak wavelength of the emission spectrum of the light emitting device 100 80% or less of whichever the lower of the relative light emission intensity of the second peak wavelength and the relative light emission intensity of the third peak wavelength, by using the red phosphor 3A and the green phosphor 3B described above and setting the difference between the peak wavelength of the red phosphor 3A and the peak wavelength of the green phosphor 3B to 120 nm or greater.

3. Yellowish Green or Yellow Phosphor

The light emitting device 100 of the present invention may be constituted by adding a YAG phosphor (YAG light emitting phosphor) 3C that emits light in a range from yellowish green to yellow, in addition to the red phosphor 3A and the green phosphor 3B. It is possible to make the minimum relative light emission intensity between the second peak wavelength and the third peak wavelength of the emission spectrum of the light emitting device 100 80% or less of whichever the lower of the relative light emission intensity of the second peak wavelength and the relative light emission intensity of the third peak wavelength, by using the YAG phosphor 3C that satisfies the following two conditions.

(1) The difference between the peak wavelength of the green phosphor 3B and the peak wavelength of the YAG phosphor 3C is 30 nm or less.
(2) The amount of the YAG phosphor 3C added is 50% or less of the total phosphor (sum of the red phosphor 3A, the green phosphor 3B and the YAG phosphor 3C) in weight percentage.

Adding the YAG phosphor 3C makes it possible to make the light emitting device 100 having high brightness and high reliability without substantially decreasing the color reproducibility, compared with a case where only two kinds of phosphor, the red phosphor 3A and the green phosphor 3B, are used.

Peak wavelength of the YAG phosphor 3C can be shifted to the longer side by, for example, substituting Y with Gd and to the shorter side by substituting Al with Ga. Also peak wavelength of the YAG phosphor 3C can be slightly shifted to the longer side by increasing the amount of Ce, or to the shorter side by decreasing the amount of Ce.

There is no particular restriction on the YAG phosphor 3C that emits light in a range from yellowish green to yellow, and any known YAG phosphor can be used as long as the two conditions described above are satisfied. A phosphor represented by the following general formula (IV) is an example of preferable one as a YAG phosphor 3C.

$$M^6{}_3M^7{}_5O_{12}\text{:Ce} \qquad (IV)$$

In the formula (IV), $M^6$ is at least one kind of element selected from among rare earth elements, and $M^7$ is at least one kind of element selected from the group consisting of B, Al, Ga and In.

4. Constitution of Light Emitting Device

One embodiment of the light emitting device 100 will be described in detail with reference to FIG. 2. The light emitting device 100 shown in FIG. 2 is a surface-mounted light emitting device but is not limited to this, and the present invention can be applied to any forms of conventionally used light emitting device such as bullet-shaped light emitting diode.

The light emitting device 100 has a light emitting element mounting body (body) 1 that has a recess opening upward. The light emitting element (blue LED) 2 is fastened with a die bonding material onto the bottom surface of the recess of the body 1, and a translucent resin 4 containing the phosphors 3A, 3B dispersed therein covers the light emitting element 2. One of electrodes of the light emitting element 2 is connected by a first wire (electrically conductive wire) 5 to a first external electrode 6, and the other electrode of the light emitting element 2 is connected by a second wire (electrically conductive wire) 7 to a second external electrode 8. Inner surface of the recess of the body 1 is covered by a light reflecting material 9.

Components of the light emitting device 100 will be described below.

Light Emitting Element

The light emitting element 2 has a light emitting layer formed from, for example, gallium nitride compound semiconductor. Light emitted by the light emitting element 2 forms the first peak of the emission spectrum of the white light emitting device 100 of the present invention, and excites the red phosphor 3A and the green phosphor 3B.

There are various nitride compound semiconductors (general formula: $In_iGa_jAl_kN$, however $0 \leq i$, $0 \leq j$, $0 \leq k$, $i+j+k=1$) such as containing InGaN and GaN that is doped with various impurities. The light emitting element 2 can be formed by growing semiconductor such as InGaN or GaN as a light emitting layer on a substrate by MOCVD process or the like. The semiconductor may have homo structure, heterostructure or double heterostructure such as MIS junction, PI junction and PN junction. Emission wavelength can be controlled by changing the kind of material and mix proportion of components of the nitride semiconductor layer, so that the light emitting element 2 has a peak wavelength in a range from 440 nm to 470 nm. The light emitting element 2 may also have a semiconductor active layer formed from a thin film where quantum effect appears in single quantum well structure or multiple quantum well structure.

Light Emitting Element Mounting Body

The light emitting element mounting body (body) 1 is preferably formed from a material that has high light blocking property, so that light emitted by the light emitting element 2 would not leak to the outside. The body makes contact with the external electrodes 6, 8 and therefore must be formed from an insulating material.

Specifically, the body may be formed from, for example, laminated sheet of glass epoxy, laminated sheet of BT resin, ceramics, liquid crystal polymer or polyimide. The body 1 can be formed by, for example, placing metal pieces intended for the external electrodes 6 and 8 in a mold, pouring the material into the mold for insertion molding operation, then, after cooled, taking the molded body from the mold.

External Electrode

The external electrodes 6 and 8 are provided for electrically connecting the light emitting element 2 with the outside of the body 1 via the first wire 5 and the second wire 7, and are preferably formed from a material that has high electrical conductivity. For example, metallised material (e.g. nickel metallised material) or good electrical conductors such as phosphor bronze, iron or copper may be used for the external electrodes 6 and 8.

Light Reflecting Material

The light reflecting material 9 may be, for example, a film-like member formed from a polyethylene terephthalate resin, a polycarbonate resin, a polypropylene resin or the like, with barium titanate, aluminum oxide, titanium oxide, silicon oxide, calcium phosphate or the like mixed therein as a reflecting material. The light reflecting material 9, for example, can be secured onto the side wall of the body 1 by means of silicone resin, epoxy resin or the like.

The light reflecting material 9 may also be a metal film such as Al, Ag, Cu or the like formed on the inside and/or the outside of the side wall of the body 1 by means of plating or sputtering process.

Die-bonding Material

The die-bonding material is used to secure the light emitting element 2 in the recess of the light emitting element mounting body. The die-bonding material must be heat resistant so that the properties thereof would not be affected by the heat generated in the light emitting element 2. For example, epoxy resin, Ag paste or eutectic material may be used as the die-bonding material.

Electrically Conductive Wire

The first wire 5 and the second wire 7 are electrically conductive wires. The first wire 5 and the second wire 7 are required to be good in ohmic contact with the electrodes of the light emitting element 2, in mechanical connectivity, electrical conductivity and heat conductivity. The electrically conductive wires used as the first wire 5 and the second wire 7 may be formed from a metal such as gold, copper, platinum, aluminums or an alloy thereof.

Translucent Resin

The translucent resin 4 that fills the recess of the body 1 contains the red phosphor 3A and the green phosphor 3B dispersed therein, and seals the light emitting element 2, the electrically conductive wires (the first wire and the second wire) 5 and 7 for the protection thereof from the external force. For the translucent resin (resin sealant) 4, various resins may be used and the translucent resin that has weatherability (or weather resistance) is preferably used such as an epoxy resin, a urea resin, or a silicone. Adding a dispersing agent to the translucent resin 4 decreases the directivity of emission from the light emitting element 2 and increases the view angle. For the dispersing agent, barium titanate, titanium oxide, aluminum oxide, silicon oxide or the like is preferably used. Various phosphors may be contained in the translucent resin in accordance to the color of light emitted by the light emitting element 2, so as to provide the light emitting device that emits light of desired color.

EXAMPLES

Examples of the present invention will be described below. These Examples are shown for the purpose of making the invention easier to understand, and are not intended to limit the scope of the present invention.

Example 1

A molten polyphthalamide resin is poured into a mold that has been closed after a pair of positive and negative external electrodes 6 and 8 has been placed therein, and is cured to form a body 1. The body 1 has an opening (recess) wherein the light emitting element 2 can be accommodated. The body 1 and the external electrodes 6 and 8 can be molded integrally, as the mold is cooled down.

The light emitting element (LED chip) 2 having a peak wavelength of 455 nm is die-bonded onto the bottom surface of the recess of the body 1 that has been formed as described above, by epoxy resin. Then the external electrode 6 and the light emitting element 2 are electrically connected with each other by means of an electrically conductive wire 5, and the external electrode 8 and the light emitting element 2 are electrically connected with each other by means of the electrically conductive wire 7.

Then about 0.25 g of a halosilicate $Ca_8MgSi_4O_{16}Cl_2$: Eu (($Ca_{7.5}$, $Eu_{0.5}$) $MgSi_4O_{16}Cl_2$) that has a peak wavelength around 525 nm and about 0.06 g of a nitride phosphor CaAlSiBN$_3$: Eu (($Ca_{0.97}$, $Eu_{0.03}$) $AlSiB_zN_{(3+z)}$) that has a peak wavelength around 660 nm are mixed with 3 g of a silicone resin composition. The translucent resin 4 that is obtained is put into the opening of the body 1 so as to form a surface flush with the top surface of the opening on both sides thereof. Last, a heat treatment is applied at 70° C. for 3 hours then at 150° C. for one hour. CaAlSiBN$_3$: Eu herein generally refers to a phosphor compound containing one or more of the stated elements. without specifically listing the proportion of the elements in the compound.

FIG. 1 shows the emission spectrum of the light emitting device 100 that is made as described above.

The spectrum has the first peak around 450 nm, the second peak around 540 nm and the third peak around 660 nm.

The minimum relative light emission intensity between the second peak wavelength and the third peak wavelength is 0.22 (22%), and is 63% of the relative light emission intensity of the second peak wavelength of 0.35 (35%) that is lower than the relative light emission intensity of the third peak wavelength of 0.39 (39%).

The mean color rendering index Ra is an index of color rendering performance defined in the Japanese Industrial Standard JIS Z 8726. The index represents the fidelity of reproducing the colors in comparison to those of a reference light source. Ra value closer to 100 indicates better color rendering performance.

A 14-inch liquid crystal backlight employing the light emitting device 100 as the light source has NTSC ratio of 72% or higher, and is capable of producing rich red color without significant decrease in brightness of white light.

Example 2

The light emitting device 100 is made by the same method as that of Example 1, except that about 0.3 g of a halosilicate Ca$_8$MgSi$_4$O$_{16}$Cl$_2$: Eu ((Ca$_{7.6}$, Eu$_{0.4}$) MgSi$_4$O$_{16}$Cl$_2$) that has a peak wavelength around 520 nm, 0.1 g of a YAG phosphor (Y$_{2.95}$(Al$_{0.8}$, Ga$_{0.2}$)$_5$O$_{12}$: Ce$_{0.05}$) that has a peak wavelength around 540 nm and a broader emission spectrum than that of the green phosphor, and about 0.11 g of a nitride phosphor CaAlSiBN$_3$: Eu ((Ca$_{0.97}$, Eu$_{0.03}$) AlSiB$_z$N$_{(3+z)}$) that has a peak wavelength around 660 nm are mixed with 3 g of a silicone resin composition.

In this Example, the difference between the peak wavelength of the green phosphor and the peak wavelength of the YAG phosphor is 20 nm, and the quantity of the added YAG phosphor is about 20% of the total phosphor.

Figure 3:
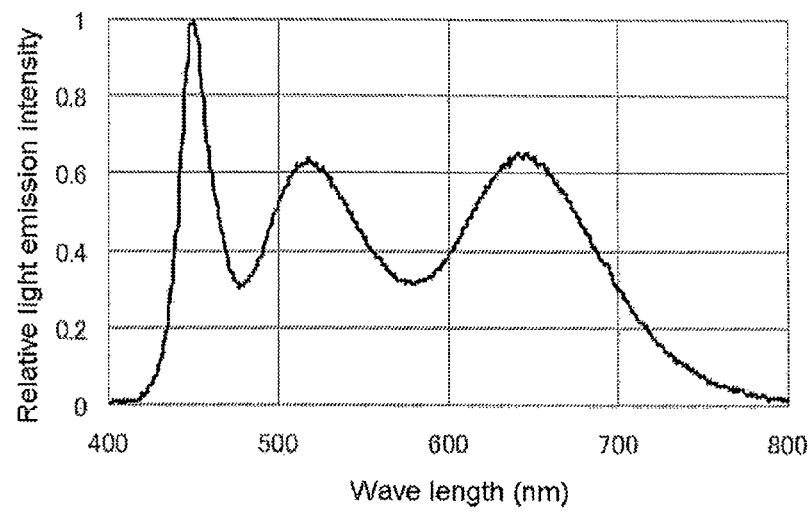
FIG. 3 is a graph showing an emission spectrum of the light emitting device 100 according to Example 2.

FIG. 3 shows the emission spectrum of the light emitting device 100 that is made as described above.

The spectrum has the first peak around 450 nm, the second peak around 520 nm and the third peak around 650 nm.

The minimum relative light emission intensity between the second peak wavelength and the third peak wavelength is 52% of the relative light emission intensity of the second peak wavelength that is lower than the relative light emission intensity of the third peak wavelength.

A light source for backlight made by using the light emitting device 100 similarly to Example 1 has NTSC ratio of 72% or higher, and is capable of increasing brightness of white light. Ra value is 79, showing high color rendering performance.

Example 3

The light emitting device 100 is made by the same method as that of Example 1, except that about 0.3 g of a halosilicate Ca$_8$MgSi$_4$O$_{16}$Cl$_2$: Eu ((Ca$_{7.6}$, Eu$_{0.4}$) MgSi$_4$O$_{16}$Cl$_2$) that has a peak wavelength around 520 nm, 0.15 g of a YAG phosphor (Y$_{2.95}$(Al$_{0.8}$, Ga$_{0.2}$)$_5$O$_{12}$ : Ce$_{0.05}$) that has a peak wavelength around 540 nm and a broader emission spectrum than that of the green phosphor, and about 0.11 g of a nitride phosphor CaAlSiBN$_3$: Eu ((Ca$_{0.97}$, Eu$_{0.03}$) AlSiB$_z$N$_{(3+z)}$) that has a peak wavelength around 660 nm are mixed with 3 g of a silicone resin composition.

In this Example, the difference between the peak wavelength of the green phosphor and the peak wavelength of the YAG phosphor is 20 nm, and the quantity of the added YAG phosphor is about 27% of the total phosphor.

Figure 4:
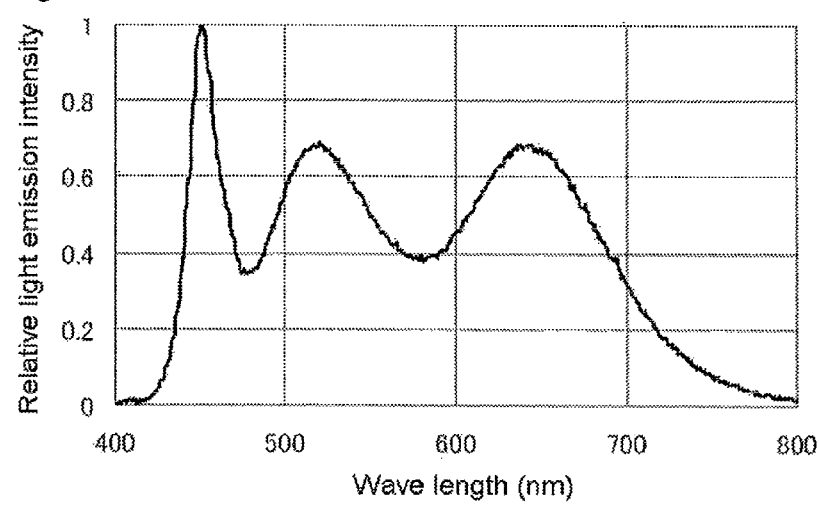
FIG. 4 is a graph showing an emission spectrum of the light emitting device 100 according to Example 3.

FIG. 4 shows the emission spectrum of the light emitting device 100 thus obtained.

The spectrum has the first peak around 450 nm, the second peak around 520 nm and the third peak around 640 nm.

The minimum relative light emission intensity between the second peak wavelength and the third peak wavelength is 61% of the relative light emission intensity of the second peak wavelength that is lower than the relative light emission intensity of the third peak wavelength.

A light source for backlight made by using the light emitting device 100 similarly to Example 1 has NTSC ratio of 72% or higher, with further higher brightness of white light. A high Ra value of 84 is obtained, showing high color rendering performance.

Example 4

The light emitting device 100 is made similarly to Example 1, except that about 0.3 g of a halosilicate Ca$_8$MgSi$_4$O$_{16}$Cl$_2$: Eu ((Ca$_{7.5}$, Eu$_{0.5}$) MgSi$_4$O$_{16}$Cl$_2$) that has a peak wavelength around 520 nm, 0.25 g of a YAG phosphor (Y$_{2.95}$(Al$_{0.8}$, Ga$_{0.2}$)$_5$O$_{12}$: Ce$_{0.05}$) that has a peak wavelength around 540 nm and a broader emission spectrum than that of the green phosphor, and about 0.13 g of a nitride phosphor CaAlSiBN$_3$: Eu ((Ca$_{0.97}$, Eu$_{0.03}$) AlSiB$_z$N$_{(3+z)}$) that has a emission peak around 660 nm are mixed with 3 g of a silicone resin composition.

In this Example, the difference between the peak wavelength of the green phosphor and the peak wavelength of the YAG phosphor is 20 nm, and the quantity of the added YAG phosphor is about 37% of the total phosphor.

Figure 5:
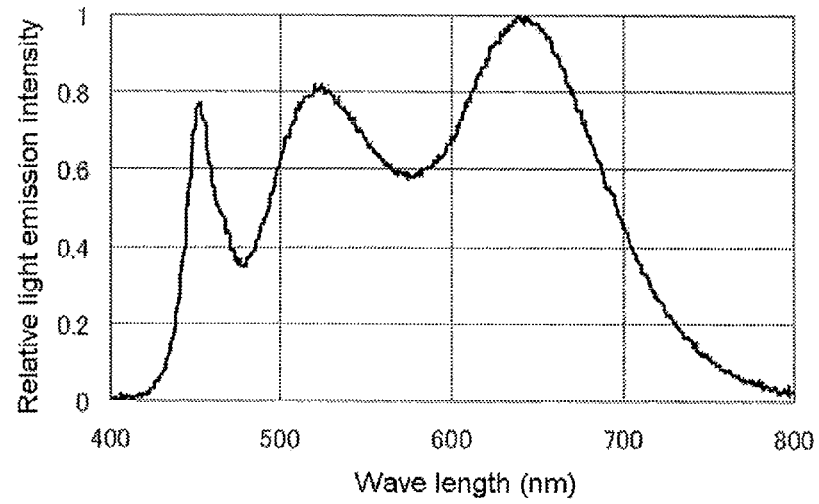
FIG. 5 is a graph showing an emission spectrum of the light emitting device 100 according to Example 4.

FIG. 5 shows the emission spectrum of the light emitting device 100 that is made as described above.

The spectrum has the first peak around 450 nm, the second peak around 520 nm and the third peak around 640 nm.

The minimum relative light emission intensity between the second peak wavelength and the third peak wavelength is 75% of the relative light emission intensity of the second peak wavelength that is lower than the relative light emission intensity of the third peak wavelength.

A light source for backlight made by using the light emitting device 100 similarly to Example 1 has NTSC ratio of 70%, with further higher brightness of white light. Ra value is as high as 89, showing fairly high color rendering performance.

Example 5

The light emitting device 100 is made by the same method as that of Example 1, except that about 0.28 g of a halosilicate Ca$_8$MgSi$_4$O$_{16}$Cl$_2$: Eu ((Ca$_{7.7}$, Eu$_{0.3}$) MgSi$_4$O$_{16}$Cl$_2$) that has a peak wavelength around 515 nm, 0.16 g of a YAG phosphor (Y$_{2.95}$(Al$_{0.8}$, Ga$_{0.2}$)$_5$O$_{12}$: Ce$_{0.05}$) that has a peak wavelength around 540 nm and a broader emission spectrum than that of the green phosphor, and about 0.2 g of a nitride phosphor CaAlSiBN$_3$: Eu ((Ca$_{0.99}$, Eu$_{0.01}$) AlSiN$_3$) that has a peak wavelength around 650 nm are mixed with 3 g of a silicone resin composition.

In this Example, the difference between the emission peak of the green phosphor and the emission peak of the YAG phosphor is 25 nm, and the quantity of the added YAG phosphor is about 31% of the total phosphor.

Figure 6:
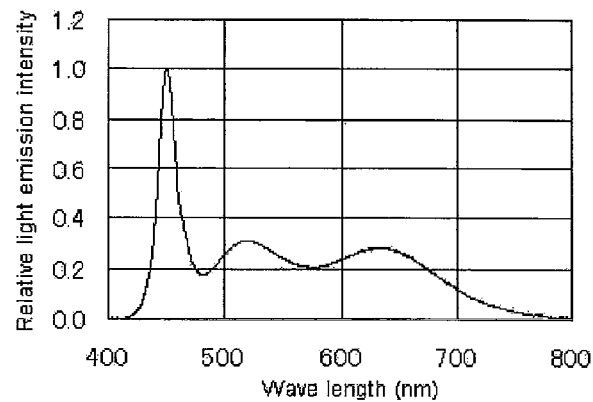
FIG. 6 is a graph showing an emission spectrum of the light emitting device 100 according to Example 5.

FIG. 6 shows the emission spectrum of the light emitting device 100 that is made as described above.

The spectrum has the first peak around 450 nm, the second peak around 520 nm and the third peak around 640 nm.

The minimum relative light emission intensity between the second peak wavelength and the third peak wavelength is 73% of the relative light emission intensity of the third peak wavelength that is lower than the relative light emission intensity of the second peak wavelength. A light source for backlight made by using the light emitting device 100 similarly to Example 1 has NTSC ratio of 72%, with further higher brightness of white light. A fairly high Ra value of 80 is obtained, showing high color rendering performance.

Example 6

The light emitting device 100 is made by the same method as that of Example 1, except that about 0.26 g of a halosilicate $Ca_{7.65}Eu_{0.5}MgSi_{4.3}O_{15.91}Cl_{1.84}$ that has a peak wavelength around 525 nm, and about 0.06 g of a nitride phosphor $CaAlSiBN_3$: Eu (($Ca_{0.97}$, $Eu_{0.03}$) $AlSiN_3$) that has a peak wavelength around 660 nm are mixed with 3 g of a silicone resin composition.

Figure 7:
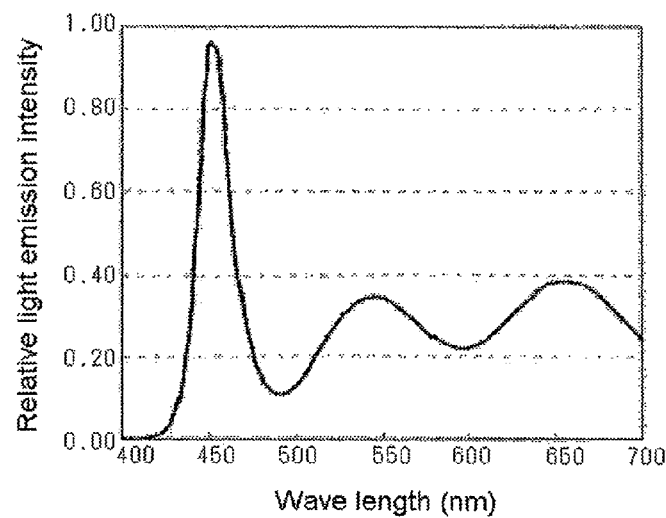
FIG. 7 is a graph showing an emission spectrum of the light emitting device 100 according to Example 6.

FIG. 7 shows the emission spectrum of the light emitting device 100 that is made as described above.

The light emitting device 100 has an emission spectrum similar to that of Example 1, which has the first peak around 450 nm, the second peak around 540 nm and the third peak around 660 nm. The minimum relative light emission intensity between the second peak wavelength and the third peak wavelength is 64% of the relative light emission intensity of the third peak wavelength that is lower than the relative light emission intensity of the second peak wavelength.

A light source for backlight made by using the light emitting device 100 similarly to Example 1 has NTSC ratio of 72%, with further higher brightness of white light. A fairly high Ra value of 78 is obtained, showing high color rendering performance.

Comparative Example 1

A light emitting device is made by the same method as that of Example 2, except that 0.76 g of a YAG phosphor ($Y_{0.8}$, $Gd_{0.2}$)$_{2.85}Al_5O_{12}$: $Ce_{0.15}$ that has a peak wavelength around 570 nm is mixed with 3 g of a silicone resin composition.

The proportion of the YAG phosphor used in Comparative Example is 100% of the total phosphor.

Figure 10:
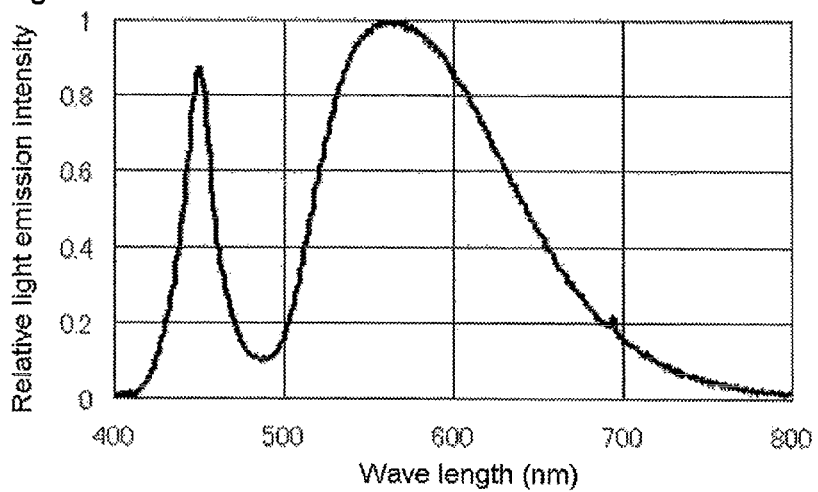
FIG. 10 is a graph showing an emission spectrum of a light emitting device according to Comparative Example 1.

FIG. 10 shows the emission spectrum of the light emitting deice that is made as described above. The light emitting device of this Comparative Example obtained as described above has an emission spectrum which has only two peaks, one caused by LED (light emitting element) and a broad peak caused by YAG. A light source for backlight made by using this light emitting device has NTSC ratio of 62% showing low color reproducibility and low Ra value of 66.

Comparative Example 2

The light emitting device is made by the same method as that of Example 1, except that about 0.1 g of a halosilicate $Ca_8MgSi_4O_{16}Cl_2$: Eu (($Ca_{7.6}$, $Eu_{0.4}$) $MgSi_4O_{16}Cl_2$) that has a peak wavelength around 520 nm, 0.3 g of a YAG phosphor ($Y_{2.95}(Al_{0.8}, Ga_{0.2})_5O_{12}$: $Ce_{0.05}$) that has a peak wavelength around 540 nm and a broader emission spectrum than that of the green phosphor, and about 0.11 g of nitride phosphor $CaAlSiBN_3$: Eu (($Ca_{0.97}$, $Eu_{0.03}$) $AlSiBN_3$) that has a peak wavelength around 660 nm are mixed with 3 g of a silicone resin composition.

In this Comparative Example, the difference between the emission peak of the green phosphor and the emission peak of the YAG phosphor is 20 nm, and the quantity of the added YAG phosphor is about 59% of the total phosphor.

Figure 11:
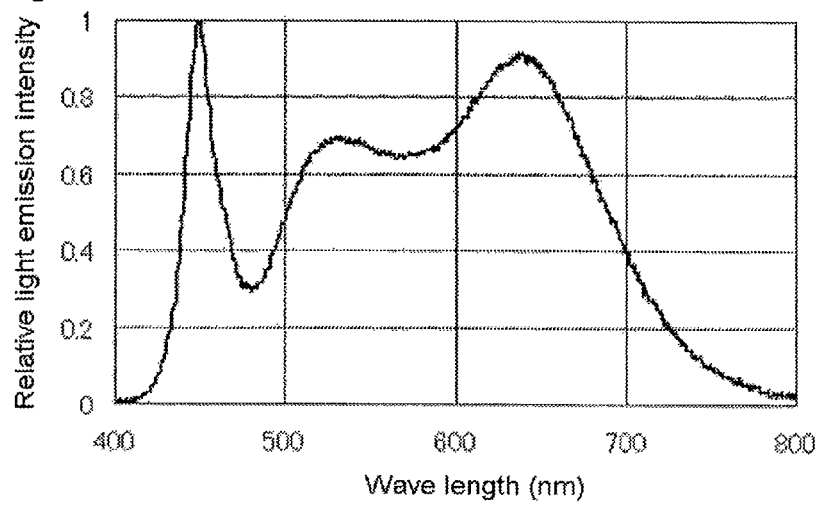
FIG. 11 is a graph showing an emission spectrum of a light emitting device according to Comparative Example 2.

FIG. 11 shows the emission spectrum of the light emitting device that is made as described above.

The spectrum has the first peak around 450 nm, the second peak around 530 nm and the third peak around 640 nm.

In the emission spectrum of the light emitting device thus obtained, the minimum relative light emission intensity between the second peak wavelength and the third peak wavelength is 96% of the relative light emission intensity of the second peak wavelength that is lower than the relative light emission intensity of the third peak wavelength.

A light source for backlight made by using this light emitting device similarly to Example 1 has low NTSC ratio of 64% showing low color reproducibility. However, Ra value is as high as 93, showing fairly high color rendering performance.

Comparative Example 3

The light emitting device is made by the same method as that of Example 1, except that about 0.22 g of a halosilicate $Ca_8MgSi_4O_{16}Cl_2$: Eu (($Ca_{7.7}$, $Eu_{0.3}$) $MgSi_4O_{16}Cl_2$) that has a peak wavelength around 515 nm, 0.2 g of a YAG phosphor ($Y_{2.95}Al_5O_{12}$: $Ce_{0.05}$) that has a peak wavelength around 560 nm and a broader emission spectrum than that of the green phosphor, and about 0.1 g of a nitride phosphor $CaAlSiBN_3$: Eu (($Ca_{0.99}$, $Eu_{0.01}$) $AlSiBN_3$) that has a peak wavelength around 650 nm are mixed with 3 g of a silicone resin composition.

In this Comparative Example, the difference between the peak wavelength of the green phosphor and the peak wavelength of the YAG phosphor is 45 nm, and the quantity of the added YAG phosphor is about 38% of the total phosphor.

Figure 12:
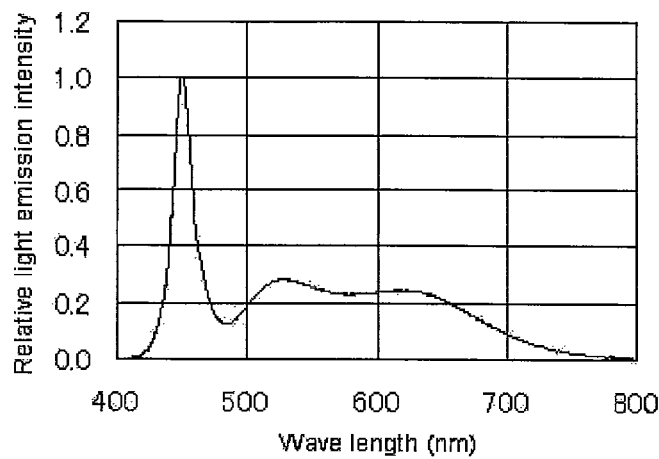
FIG. 12 is a graph showing an emission spectrum of a light emitting device according to Comparative Example 3.

FIG. 12 shows the emission spectrum of the light emitting device that is made as described above.

The spectrum has the first peak around 450 nm, the second peak around 520 nm and the third peak around 630 nm.

In the emission spectrum of the light emitting device thus obtained, the minimum relative light emission intensity between the second peak wavelength and the third peak wavelength is 97% of the relative light emission intensity of the third peak wavelength that is lower than the relative light emission intensity of the second peak wavelength. A light source for backlight made by using this light emitting device similarly to Example 1 has low NTSC ratio of 68% showing low color reproducibility. Brightness of white light is higher than that of Example 5. Fairly high Ra value of 90 is obtained, showing high color rendering performance.

Comparative Example 4

The light emitting device is made by the same method as that of Example 1, except that about 0.18 g of a halosilicate $Ca_8MgSi_4O_{16}Cl_2$: Eu (($Ca_{7.7}$, $Eu_{0.3}$)$MgSi_4O_{16}Cl_2$) that has an emission peak around 515 nm, 0.08 g of a YAG phosphor ($Y_{2.95}Al_5O_{12}$: $Ce_{0.05}$) that has a peak wavelength around 560 nm and a broader emission spectrum than that of the green phosphor, and about 0.26 g of a nitride phosphor $CaAlSiBN_3$: Eu (($Ca_{0.99}$, $Eu_{0.01}$) $AlSiBN_3$) that has a peak wavelength around 650 nm are mixed with 3 g of a silicone resin composition.

In this Comparative Example, the difference between the peak wavelength of the green phosphor and the peak wavelength of the YAG phosphor is 45 nm, and the quantity of the added YAG phosphor is about 50% of the total phosphor.

Figure 13:
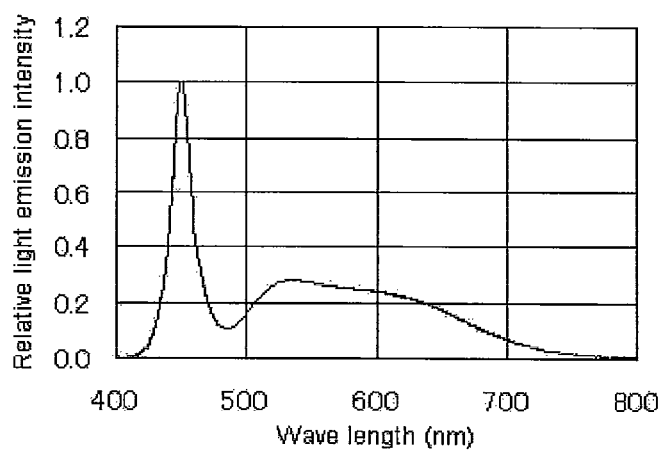
FIG. 13 is a graph showing an emission spectrum of a light emitting device according to Comparative Example 4.

FIG. 13 shows the emission spectrum of the light emitting device that is made as described above.

The emission spectrum of the light emitting device thus obtained has two emission peaks, one caused by LED and a broad emission peak caused by YAG phosphor, without distinct third peak. A light source for backlight made by using this light emitting device similarly to Example 1 has NTSC ratio of 62% showing low color reproducibility. Brightness of white light is higher than that of Example 5. Ra value is as high as 92, showing high color rendering performance.

Comparative Example 5

The light emitting device is made by the same method as that of Example 1, except that about 0.28 g of a halosilicate $Ca_8MgSi_4O_{16}Cl_2$: Eu (($Ca_{7.7}$, $Eu_{0.3}$) $MgSi_4O_{16}Cl_2$) that has a emission peak around 515 nm, 0.16 g of a YAG phosphor ($Y_{2.95}Al_5O_{12}$: $Ce_{0.05}$) that has a peak wavelength around 560 nm and a broader emission spectrum than that of the green phosphor, and about 0.14 g of a nitride phosphor $CaAlSiBN_3$: Eu (($Ca_{0.99}$, $Eu_{0.01}$) $AlSiBN_3$) that has a emission peak around 650 nm are mixed with 3 g of a silicone resin composition.

In this Comparative Example, the difference between the emission peak of the green phosphor and the emission peak of the YAG phosphor is 45 nm, and the quantity of the added YAG phosphor is about 25% of the total phosphor.

Figure 14:
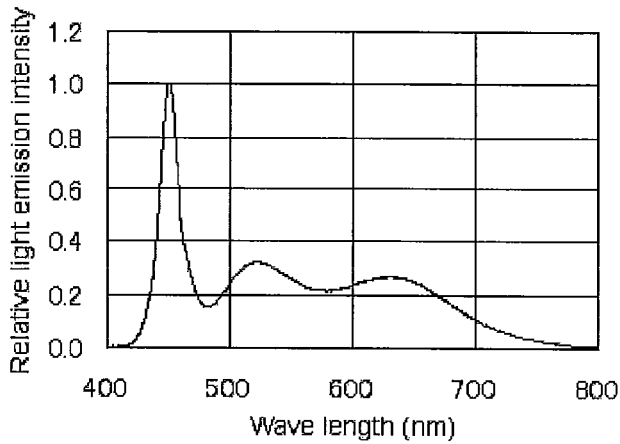
FIG. 14 is a graph showing an emission spectrum of a light emitting device according to Comparative Example 5.

FIG. 14 shows the emission spectrum of the light emitting device that is made as described above.

The spectrum has the first peak around 450 nm, the second peak around 520 nm and the third peak around 640 nm.

In the emission spectrum of this light emitting device thus obtained, the minimum relative light emission intensity between the second peak wavelength and the third peak wavelength is 82% of the relative light emission intensity of the third peak wavelength that is lower than the relative light emission intensity of the second peak wavelength. A light source for backlight made by using the light emitting device similarly to Example 1 has low NTSC ratio of 68% showing low color reproducibility. Brightness of white light is higher than that of Example 5. Fairly high Ra value of 88 is obtained, showing high color rendering performance.

Comparative Example 6

The light emitting device is made by the same method as that of Example 1, except that about 0.28 g of a halosilicate $Ca_8MgSi_4O_{16}Cl_2$: Eu (($Ca_{7.7}$, $Eu_{0.3}$) $MgSi_4O_{16}Cl_2$) that has a emission peak around 515 nm, 0.14 g of a YAG phosphor ($Y_{0.8}$, $Gd_{0.2}$)$_{2.85}Al_5O_{12}$: $Ce_{0.15}$ that has a peak wavelength around 570 nm and a broader emission spectrum than that of the green phosphor, and about 0.2 g of a nitride phosphor $CaAlSiBN_3$: Eu (($Ca_{0.99}$, $Eu_{0.01}$) $AlSiBN_3$) that has a emission peak around 650 nm are mixed with 3 g of a silicone resin composition.

In this Comparative Example, the difference between the emission peak of the green phosphor and the emission peak of the YAG phosphor is 55 nm, and the quantity of the added YAG phosphor is about 32% of the total phosphor.

Figure 15:
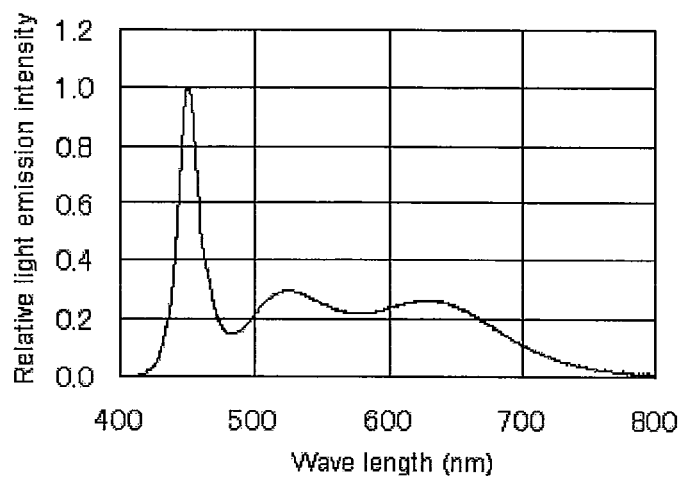
FIG. 15 is a graph showing an emission spectrum of a light emitting device according to Comparative Example 6.

FIG. 15 shows the emission spectrum of the light emitting device that is made as described above.

The spectrum has the first peak around 450 nm, the second peak around 520 nm and the third peak around 630 nm.

In the emission spectrum of the light emitting device thus obtained, the minimum relative light emission intensity between the second peak wavelength and the third peak wavelength is about 83% of the relative light emission intensity of the third peak wavelength that is lower than the relative light emission intensity of the second peak wavelength. A light source for backlight made by using the light emitting device similarly to Example 1 has low NTSC ratio of 67% showing low color reproducibility. Brightness of white light is higher than that of Example 5. Fairly high Ra value of 89 is obtained, showing high color rendering performance.

Comparative Example 7

The light emitting device is made by the same method as that of Example 1, except that about 0.16 g of a halosilicate $Ca_8MgSi_4O_{16}Cl_2$: Eu (($Ca_{7.5}$, $Eu_{0.5}$) $MgSi_4O_{16}Cl_2$) that has a peak wavelength around 525 nm, 0.12 g of a YAG phosphor ($Y_{2.05}Al_5O_{12}$: $Ce_{0.05}$) that has a peak wavelength around 560 nm and a broader emission spectrum than that of the green phosphor, and about 0.2 g of a nitride phosphor $CaAlSiBN_3$: Eu (($Ca_{0.99}$, $Eu_{0.01}$) $AlSiBN_3$) that has a peak wavelength around 650 nm are mixed with 3 g of a silicone resin composition.

In this Comparative Example, the difference between the emission peak of the green phosphor and the emission peak wavelength of the YAG phosphor is 35 nm, and the quantity of the added YAG phosphor is about 42% of the total phosphor.

Figure 16:
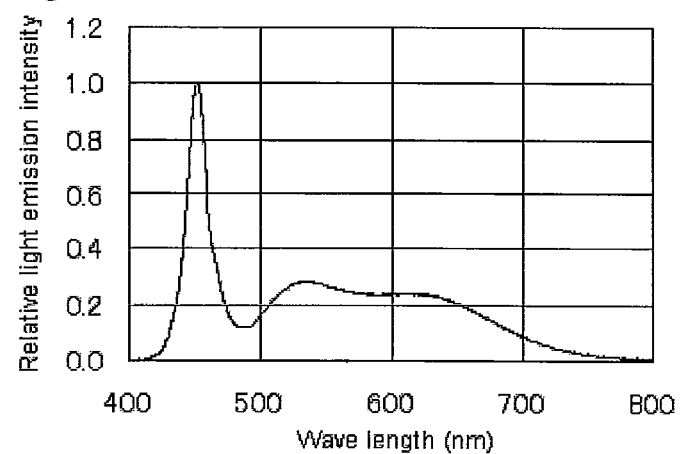
FIG. 16 is a graph showing an emission spectrum of a light emitting device according to Comparative Example 7.

FIG. 16 shows the emission spectrum of the light emitting device thus obtained. The spectrum has only two emission peaks, one caused by LED and a broad emission peak, caused by the phosphor, without third peak. A light source for backlight made by using this light emitting device similarly to Example 1 has low NTSC ratio of 66% showing low color reproducibility. Brightness of white light is higher than that of Example 1. Ra value is as high as 88, showing fairly high color rendering performance.

Comparative Example 8

The light emitting device is made by the same method as that of Example 1, except that about 0.22 g of a halosilicate $Ca_{7.85}Eu_{0.3}MgSi_{4.3}O_{15.91}Cl_{11.84}$ that has a peak wavelength around 515 nm, 0.2 g of a YAG phosphor ($Y_{2.95}Al_5O_{12}$: $Ce_{0.05}$) that has a peak wavelength around 560 nm and a broader emission spectrum than that of the green phosphor, and about 0.1 g of a nitride phosphor $CaAlSiBN_3$: Eu (($Ca_{0.99}$, $Eu_{0.01}$) $AlSiBN_3$) that has a emission peak around 650 nm are mixed with 3 g of a silicone resin composition.

In this Comparative Example, the difference between the emission peak of the green phosphor and the emission peak of the YAG phosphor is 45 nm, and the quantity of the added YAG phosphor is about 38% of the total phosphor.

Figure 17:
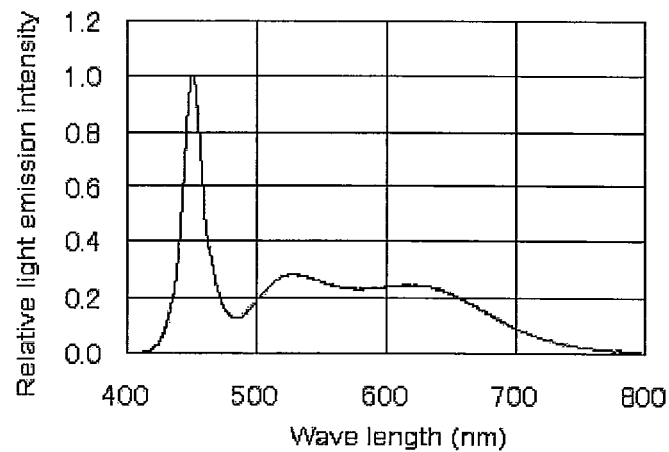
FIG. 17 is a graph showing an emission spectrum of a light emitting device according to Comparative Example 8.

FIG. 17 shows the emission spectrum of the light emitting device that is made as described above.

The spectrum has the first peak around 450 nm, the second peak around 520 nm and the third peak around 630 nm.

In the emission spectrum of the light emitting device thus obtained, the minimum relative light emission intensity between the second peak wavelength and the third peak wavelength is about 97% of the relative light emission intensity of the third peak wavelength that is lower than the relative light emission intensity of the second peak wavelength. A light source for backlight made by using this light emitting device similarly to Example 1 has low NTSC ratio of 68% showing low color reproducibility. Brightness of white light is higher than that of Example 5. Ra value is as high as 89, showing fairly high color rendering performance.

Industrial Applicability

The present invention can be applied not only to lighting devices but also to the backlight of display apparatus such as monitor, digital camera or printer where it is required to clearly reproduce the RGB colors. Addition of a YAG phosphor enables it to provide a light emitting device that has high color rendering performance.

The invention claimed is:

1. A light emitting device comprising a light emitting element, a red phosphor formed from a nitride phosphor and a green phosphor formed from a halosilicate,
the emission spectrum having a first peak at a wavelength between 440 nm and 470 nm, a second peak at a wavelength between 510 nm and 550 nm and a third peak at a wavelength between 630 nm and 670 nm,
the minimum relative light emission intensity between the second peak wavelength and the third peak wavelength of the emission spectrum being 52% or more and 80% or less of whichever the lower of the relative light emission intensity of the second peak wavelength and the relative light emission intensity of the third peak wavelength,
wherein the red phosphor is activated with Eu and is represented by the following general formula (I):

$$M^1{}_w Al_x Si_y B_z N_{(2/3)w+x+(4/3)y+z} : Eu^{2+} \qquad (I)$$

wherein $M^1$ is at least one kind of element selected from the group consisting of Mg, Ca, Sr and Ba, and relations: $0.5 \leq w \leq 3$, $x=1$, $0.167 \leq y \leq 8.7$ and $0 \leq z \leq 0.5$ are satisfied, and
the green phosphor is represented by the following general formula (II) or general formula (III):
formula (II) being $$(M^2{}_{1-y} Eu_y)_a MgM^3{}_b O_{(a+2b)} X_2$$

wherein $M^2$ is at least one kind of element selected from the group consisting of Ca, Sr, Ba, Zn and Mn, $M^3$ is Si, X is Cl, and relations: $0.001 \leq y \leq 0.3$, $7.0 \leq a < 10.0$, and $3.0 \leq b < 5.0$ are satisfied,
formula (III) being $$M^5{}_x Eu_y MgSi_2 O_a X_b$$

wherein $M^5$ is at least one kind of element selected from the group consisting of Ca, Sr, Ba, Zn and Mn, X is Cl, and relations: $6.5 \leq x < 8.0$, $0.01 \leq y \leq 2.0$, $3.7 \leq z \leq 4.3$, $a = x+y+1+2z-b/2$, and $1.0 \leq b \leq 1.9$ are satisfied.

2. The light emitting device according to claim 1, wherein the difference between the peak wavelength of the red phosphor and the peak wavelength of the green phosphor is 120 nm or more.

3. The light emitting device according to claim 1, further comprising a phosphor represented by the following general formula (IV):

$$M^6{}_3 M^7{}_5 O_{12} : Ce \qquad (IV)$$

wherein $M^6$ is at least one kind of element selected from the group consisting of the rare earth elements, and $M^7$ is at least one kind of element selected from the group consisting of B, Al, Ga and In.

4. The light emitting device according to claim 3, wherein the difference between the peak wavelength of the green phosphor and the peak wavelength of the phosphor represented by the general formula (IV) is 30 nm or less.

5. The light emitting device according to claim 3, wherein the proportion of the phosphor represented by the general formula (IV) is 50% or less of the total phosphor in the light emitting device, in weight percentage.

6. The light emitting device according to claim 3, wherein in the light emitting device, the proportion of the phosphor represented by the general formula (IV) is a YAG phosphor.

7. The light emitting device according to claim 3, wherein said red phosphor is excited by said light emitting element to emit red light, and said green phosphor is excited by said light emitting element to emit green light, such that said light emitting device produces said emission spectrum.

8. The light emitting device according to claim 1, wherein the relative light emission intensity of the second peak wavelength is lower than that of the third peak wavelength.

9. A light emitting device comprising a light emitting element, a red phosphor formed from a nitride phosphor and a green phosphor formed from a halosilicate,
the emission spectrum having a first peak, a second peak and a third peak, the second peak wavelength being longer than the first peak wavelength, the third peak wavelength being longer than the second peak wavelength,
the minimum relative light emission intensity between the second peak wavelength and the third peak wavelength of the emission spectrum being 52% or more and 80% or less of whichever the lower of the relative light emission intensity of the second peak wavelength and the relative light emission intensity of the third peak wavelength,
wherein the red phosphor is activated with Eu and is represented by the following general formula (I):

$$M^1{}_w Al_x Si_y B_z N_{(2/3)w+x+(4/3)y+z} : Eu^{2+} \qquad (I)$$

wherein $M^1$ is at least one kind of element selected from the group consisting of Mg, Ca, Sr and Ba, and relations: $0.5 \leq w \leq 3$, $x=1$, $0.167 \leq y \leq 8.7$ and $0 \leq z \leq 0.5$ are satisfied, and
the green phosphor is represented by the following general formula (II) or general formula (III):
formula (II) being $$(M^2{}_{1-y} Eu_y)_a MgM^3{}_b O_{(a+2b)} X_2$$

wherein $M^2$ is at least one kind of element selected from the group consisting of Ca, Sr, Ba, Zn and Mn, $M^3$ is Si, X is Cl, and relations: $0.001 \leq y \leq 0.3$, $7.0 \leq a < 10.0$, and $3.0 \leq b < 5.0$ are satisfied,
formula (III) being $$M^5{}_x Eu_y MgSi_2 O_a X_b$$

wherein $M^5$ is at least one kind of element selected from the group consisting of Ca, Sr, Ba, Zn and Mn, X is Cl, and relations: $6.5 \leq x < 8.0$, $0.01 \leq y \leq 2.0$, $3.7 \leq z \leq 4.3$, $a = x+y+1+2z-b/2$, and $1.0 \leq b \leq 1.9$ are satisfied.

10. The light emitting device according to claim 9, wherein the light emitting element comprises a nitride compound semiconductor.

11. The light emitting device according to claim 9, wherein the light emitting element comprises InGaN as a light emitting layer.

12. The light emitting device according to claim 9, wherein the green phosphor is $Ca_8 MgSi_4 O_{16} Cl_2 : Eu$.

13. The light emitting device according to claim 9, wherein the red phosphor is $CaAlSiBN_3 : Eu$.

14. A light emitting device comprising a light emitting element, a red phosphor formed from a nitride phosphor and a green phosphor formed from a halosilicate,
the emission spectrum having a first peak, a second peak and a third peak, the second peak wavelength being longer than the first peak wavelength, the third peak wavelength being longer than the second peak wavelength, the minimum relative light emission intensity between the second peak wavelength and the third peak wavelength of the emission spectrum being 52% or more and 80% or less of whichever the lower of the relative light emission intensity of the second peak wavelength and the relative light emission intensity of the third peak wavelength, wherein the red phosphor is activated with Eu and is represented by the following general formula (I):

$$M^1{}_w Al_x Si_y B_z N_{(2/3)w+x+(4/3)y+z} : Eu^{2+} \quad (I)$$

wherein $M^1$ is at least one kind of element selected from the group consisting of Mg, Ca, Sr and Ba, and relations: $0.5 \le w \le 3$, $x=1$, $0.167 \le y \le 8.7$ and $0 \le z \le 0.5$ are satisfied, and the green phosphor is represented by the following general formula (II) or general formula (III):

formula (II) being $$(M^2{}_{1-y} Eu_y)_a MgM^3{}_b O_{(a+2b)} X_2$$

wherein $M^2$ is at least one kind of element selected from the group consisting of Ca, Sr, Ba, Zn and Mn, $M^3$ is Si, X is Cl, and relations: $0.001 \le y \le 0.3$, $7.0 \le a < 10.0$, and $3.0 \le b < 5.0$ are satisfied, formula (III) being $$M^5{}_x Eu_y MgSi_z O_a X_b$$

wherein $M^5$ is at least one kind of element selected from the group consisting of Ca, Sr, Ba, Zn and Mn, X is Cl, and relations: $6.5 \le x < 8.0$, $0.01 \le y \le 2.0$, $3.7 \le z \le 4.3$, $a = x+y+1+2z-b/2$, and $1.0 \le b \le 1.9$ are satisfied, and said light emitting device further comprising a phosphor represented by the following general formula (IV):

$$M^6{}_3 M^7{}_5 O_{12} : Ce \quad (IV)$$

wherein $M^6$ is at least one kind of element selected from the group consisting of the rare earth elements, and $M^7$ is at least one kind of element selected from the group consisting of B, Al, Ga and In.

15. The light emitting device according to claim 14, wherein the light emitting element comprises a nitride compound semiconductor.

16. The light emitting device according to claim 14, wherein the light emitting element comprises InGaN as a light emitting layer.

17. The light emitting device according to claim 14, wherein the green phosphor is $Ca_8 MgSi_4 O_{16} Cl_2$: Eu.

* * * * *